United States Patent
Eberler et al.

(10) Patent No.: US 7,986,142 B2
(45) Date of Patent: Jul. 26, 2011

(54) APPARATUS FOR CONTROLLING AN MRI ANTENNA ARRANGEMENT WITH ELLIPTICAL POLARIZATION AND EQUAL AMPLITUDE SIGNALS AT FEED POINTS

(75) Inventors: Ludwig Eberler, Postbauer-Heng (DE); Juergen Nistler, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 266 days.

(21) Appl. No.: 12/358,498

(22) Filed: Jan. 23, 2009

(65) Prior Publication Data
US 2009/0189609 A1 Jul. 30, 2009

(30) Foreign Application Priority Data

Jan. 24, 2008 (DE) .................. 10 2008 005 994

(51) Int. Cl.
*G01V 3/00* (2006.01)
(52) U.S. Cl. ........................... 324/318; 324/322
(58) Field of Classification Search .......... 324/300–322; 600/407–435; 359/122, 488; 331/3; 382/128–131; 333/219–235
See application file for complete search history.

(56) References Cited

U.S. PATENT DOCUMENTS

| | | | | |
|---|---|---|---|---|
| 3,165,705 A | * | 1/1965 | Dicke | 331/3 |
| 4,594,566 A | * | 6/1986 | Maudsley | 333/219 |
| 4,689,563 A | * | 8/1987 | Bottomley et al. | 324/309 |
| 5,132,621 A | * | 7/1992 | Kang et al. | 324/322 |
| 5,179,332 A | * | 1/1993 | Kang | 324/313 |
| 5,986,454 A | * | 11/1999 | Leifer | 324/318 |
| 7,135,864 B1 | * | 11/2006 | McKinnon et al. | 324/318 |
| 7,649,353 B2 | * | 1/2010 | Feiweier et al. | 324/309 |
| 7,847,554 B2 | * | 12/2010 | Nistler et al. | 324/318 |
| 2002/0044353 A1 | * | 4/2002 | Salzman | 359/488 |
| 2002/0114032 A1 | * | 8/2002 | Salzman | 359/122 |
| 2003/0184293 A1 | | 10/2003 | Boskamp et al. | 324/318 |
| 2004/0070398 A1 | * | 4/2004 | Wong | 324/322 |
| 2008/0284432 A1 | * | 11/2008 | Nistler et al. | 324/307 |
| 2009/0189609 A1 | * | 7/2009 | Eberler et al. | 324/322 |
| 2009/0192382 A1 | * | 7/2009 | Nistler et al. | 324/322 |
| 2009/0245603 A1 | * | 10/2009 | Koruga et al. | 382/128 |
| 2009/0309594 A1 | * | 12/2009 | Feiweier et al. | 324/309 |

\* cited by examiner

*Primary Examiner* — Brij B. Shrivastav
*Assistant Examiner* — Tiffany A Fetzner
(74) *Attorney, Agent, or Firm* — Schiff Hardin LLP

(57) ABSTRACT

A cylindrical antenna arrangement in a magnetic resonance apparatus has two feed points to feed in two partial signals, the two feed points being arranged on a cross-section of the antenna arrangement. The cross-section has a center point. A first angle is formed by the connection of a first feed point with the center point relative to a horizontal axis of the cross-section while a second angle is formed by the connection of a second feed point with the center point relative to the horizontal axis of the cross-section. An apparatus for controlling such an antenna arrangement has a device for signal splitting with two outputs and an input. A radio-frequency magnetic resonance signal is connected at the input. This signal is divided by the device for signal splitting into two partial signals of equal amplitude that are respectively supplied to an associated output. Each output of the device for signal splitting is connected with precisely one associated feed point of the antenna arrangement. An ellipse position in space is set for an elliptical polarization via the selection of the two angles. A device for phase adjustment is interposed between precisely one output of the device for signal splitting and the associated feed point in order to set an elliptical semi-axis ratio via variation of the phase difference of the two partial signals.

7 Claims, 4 Drawing Sheets

APPARATUS FOR CONTROLLING AN MRI ANTENNA ARRANGEMENT WITH ELLIPTICAL POLARIZATION AND EQUAL AMPLITUDE SIGNALS AT FEED POINTS

BACKGROUND OF THE INVENTION

1. Field of the Invention

The present invention concerns an apparatus for controlling an antenna arrangement in a magnetic resonance apparatus, wherein the antenna arrangement is of the type having two feed points that respectively feed in two partial signals, the two feed points being arranged on a cross-section of the antenna arrangement that has a center point, with a first of the feed points forming a first angle with the center point relative to a horizontal axis of the cross-section, and the second of the feed points forming a second angle with the center point relative to the horizontal axis of the cross section.

2. Description of the Prior Art

In magnetic resonance apparatuses with magnetic field strength of greater than/equal to three Tesla, considerable eddy currents can be induced in the body of a patient to be examined.

In such apparatuses, the homogeneous B1 magnetic field (RF field) of the antenna arrangement used for magnetic resonance examination is affected by the presence of the patient's body so that inhomogeneities occur in the B1 magnetic field. In specific cases this leads to problems in the evaluation of measurement results and/or to problems in the imaging of specific body regions.

In conventional magnetic resonance systems, a field distribution is achieved with the antenna arrangement used for examination, wherein the antenna arrangement for whole-body examinations is fashioned as a birdcage antenna, for example.

FIG. 3 shows an exemplary arrangement to feed an antenna arrangement ANT according to the prior art.

The antenna arrangement ANT is designed as a cylindrical birdcage antenna and possesses two feed points A1x and A2x as well as eight longitudinal rods LS1 through LS8 shown here.

The two ends of the longitudinal rods LS1 through LS8 are respectively connected with one another via circular termination rings AR1 and AR2.

A device SPLIT1 for signal splitting possesses two outputs OUT11, OUT21 as well as an input IN11. an amplified radio-frequency magnetic resonance signal VSS, obtained by amplification in a pre-amplifier PA of a detected signal SS, is connected to the input IN11 of the device SPLIT1 for signal splitting. This radio-frequency magnetic resonance signal VSS is divided by the device SPLIT1 for signal splitting into two partial signals SS11 and SS21 of equal amplitude that possess a phase difference of 90° relative to one another.

A first partial signal SS11 is therefore present at a first output OUT11 of the device SPLIT1 for signal splitting while a second partial signal SS21 that is phase-shifted relative to this first partial signal SS11 is present at a second output OUT21.

An additional input IN21 of the device SPLIT1 for signal splitting is connected via a terminating resistor Z1 with a compensation potential (ground) in which the power reflected by the antenna is absorbed.

Each of the two outputs OUT11, OUT21 is connected with precisely one feed point A1x, A2x of the antenna arrangement ANT so that the antenna arrangement ANT develops what is known as a circularly polarized magnetic field via the partial signals SS11, SS21.

FIG. 3 also shows two circular cross-sections QS1, QS2 of the cylindrical antenna arrangement ANT. The two cross-sections QS1, QS2 differ in the spatial arrangement of the two feed points A1x and A2x.

The two feed points A1x, A2x form a right triangle with a center point M of the circular cross-section. The right angle of this right triangle is present at the center point M.

In a circular cross-section QS1, a first feed point A11 is arranged at an angle α11 of −90° relative to a horizontal axis of the circle or, respectively, the circular cross-section QS1. A second feed point A21 is arranged at an angle α22 of 0° relative to the horizontal axis of the circle or, respectively, of the circular cross-section QS1.

This arrangement of the two feed points A11, A21 causes the radiating elements of the antenna arrangement to be mutually decoupled, and this decoupling is not disrupted by the presence of a patient.

In the circular cross-section QS2, a first feed point A12 is arranged at an angle α11 of −135° relative to a horizontal axis of the circle, or of the circular cross-section QS2. A second feed point A22 is arranged at an angle α22 of −45° relative to the horizontal axis of the circle or, respectively, of the circular cross-section QS2.

This arrangement of the two feed points A12, A22 causes the radiating elements of the antenna arrangement to be uniformly loaded by the body of the patient.

With reference to FIG. 3, FIG. 4 shows an additional exemplary arrangement for feeding an antenna arrangement ANT according to the prior art.

Each of the two outputs OUT11, OUT21 is connected via respective adjustment devices EV1, EV2 with precisely one of the feed points A1, A2 of the antenna arrangement ANT.

With the use of the adjustment devices EV1, EV2, the two partial signals SS11 and SS21 are varied in their phase difference relative to one another in order to form a cross-polarized magnetic field.

Furthermore, it is known in the prior art to control two inputs or feed points of an antenna arrangement with partial signals such that the antenna arrangement forms not a circularly polarized magnetic field, but rather an elliptically polarized magnetic field.

For this purpose, additional components are necessary which help the two partial signals exhibit unequal amplitudes and phase positions and arrive in this way at the antenna arrangement.

As described above, in these apparatuses the antenna arrangement that is used is affected by the real patient body such that inhomogeneities in the B1 field occur that in turn lead to disruptions in the imaging of specific body regions.

It should be noted that, although a magnetic field within an empty antenna arrangement is elliptically polarized, a circularly polarized magnetic field is formed in the patient by interaction between the patient and the elliptical field.

SUMMARY OF THE INVENTION

An object of the present invention is to provide an improved control of an antenna arrangement of the type described above.

This object is achieved by an apparatus according to the invention to control an antenna arrangement in a magnetic resonance apparatus that has a cylindrical antenna arrangement, wherein the antenna arrangement has two feed points to feed in two partial signals, and wherein these are arranged on a cross-section of the cylindrical antenna arrangement.

The cross-section has a center point, and a first angle is formed by the connection of a first feed point with the center point relative to a horizontal axis of the cross-section, and a second angle, different from the first angle, is formed by the connection of a second feed point with the center point relative to the horizontal axis of the cross-section.

A device for signal splitting has two outputs and an input, and a radio-frequency magnetic resonance signal is connected at the input. This signal is divided by the device for signal splitting into two partial signals of equal amplitude so that a respective partial signal is present at an associated output. Each output of the device for signal splitting is connected with precisely one associated feed point of the antenna arrangement.

In the present invention it was recognized that an adjustment of the amplitudes of the partial signals to form an elliptical polarization can be omitted when the two feed points of the antenna arrangement are chosen at selected, specific points of the geometry antenna arrangement.

According to the invention, a desired ellipse position in space is thus set for the elliptical polarization via the selection of the geometric angle—an amplitude variation in the partial signals by a suitable angle setting can therefore be omitted.

For this purpose, a phase adjustment device with which the phase difference of the two partial signals is variable is additionally interposed between precisely one output of the device for signal splitting and the associated feed point. A semi-axis ratio for the elliptical polarization can therefore be set in order to affect the ellipse shape.

The ellipse shape of the elliptical polarization is thus on the one hand defined by the semi-axis ratio and by the position of the ellipse in space.

In the present invention it was recognized that the ellipse position in space can be set via the geometric position of the two feed points of the antenna arrangement while it becomes possible to set the semi-axis ratio of the ellipse via variation of the phase difference of the two partial signals.

Compared to the prior art, it is possible to avoid the use of, and thus the cost for, complicated components for adjustment or variation of the amplitude ratio of the partial signals.

The arrangement according to the invention enables a variation of the semi-axis ratio of the elliptical polarization— and therefore a variation or improvement of the imaging— dependent on the patient to be examined, or dependent on different body regions of a patient that are to be examined.

In particular, "thin" ellipses with a corresponding semi-axis ratio lead to excellent image results.

To produce the different semi-axis ratios, the antenna device is controlled with partial signals that difference with regard to their phase difference.

It is thereby possible to examine a number of patients in order to set a suitable ellipse shape in advance based on this. This is then used in further examinations.

As an alternative, it is possible to optimally set the shape of the ellipse during the examination of a patient via variation of the phase difference of the partial signals relative to the imaging.

DESCRIPTION OF THE PREFERRED EMBODIMENTS

Figure 1:
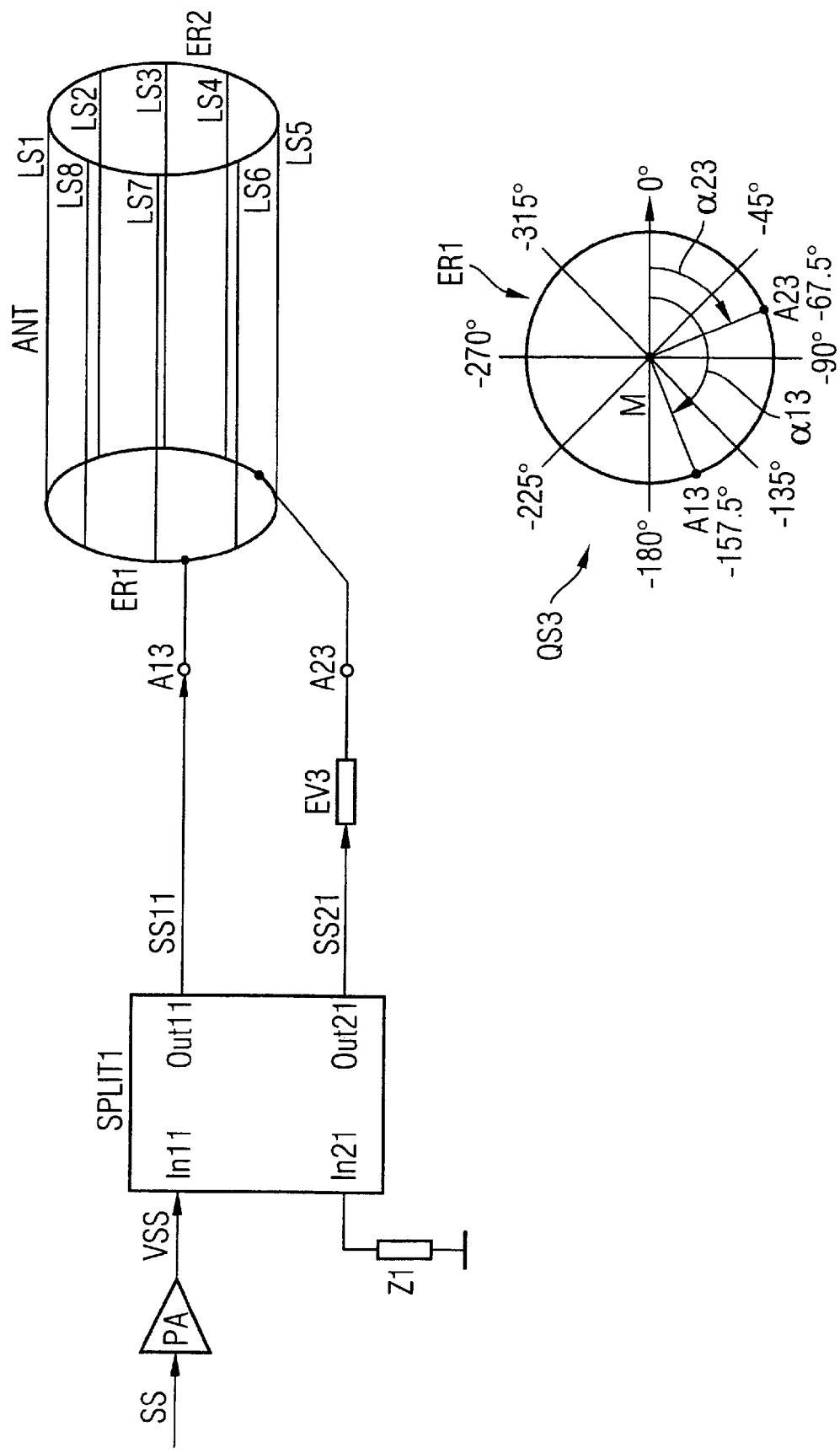
FIG. 1 illustrates an arrangement according to the invention for feeding an antenna device.

FIG. 1 shows an arrangement according to the invention for feeding an antenna device ANT.

The antenna arrangement ANT is designed as a cylindrical birdcage antenna and possesses two feed points A13 and A23 as well as eight longitudinal rods LS1 through LS8 (shown here).

The two ends of the longitudinal rods LS1 through LS8 are respectively connected with one another via a circular terminating ring ER1 and ER2.

A device SPLIT1 for signal splitting has two outputs OUT11, OUT21 as well as an input IN11. an amplified radio-frequency magnetic resonance signal VSS, obtained by amplification in a pre-amplifier PA of a detected signal SS, is connected to the input IN11 of the device SPLIT1 for signal splitting. This radio-frequency magnetic resonance signal VSS is divided by the device SPLIT1 for signal splitting into two partial signals SS11 and SS21 of equal amplitude that exhibit a phase difference of 90° relative to one another.

A first partial signal SS11 is therefore present at a first output OUT11 while a second partial signal SS21 that is phase-shifted relative to this first partial signal SS11 is present at a second output OUT21.

For resistance matching, an additional input IN21 of the device SPLIT1 for signal splitting is connected with a compensation potential (ground) via a resistor. Z1.

The first output OUT11 is directly connected with its directly associated feed point A13 of the antenna arrangement ANT while the second output OUT21 is connected via a device EV3 for phase shifting with its associated feed point A23 of the antenna arrangement ANT.

The phase or the phase position of the second partial signal SS21 is varied by the device EV3 for phase adjustment before the feeding into the antenna device ANT.

Using a circular cross-section QS3 of the cylindrical antenna arrangement ANT, FIG. 1 shows the position of the two feed points A13 and A23.

It is also possible to associate the two feed points with corresponding associable longitudinal rods LS while maintaining the angle positions illustrated in the following.

With the center point M of the circular cross-section QS3, the two feed points A13 and A23 form a right triangle with the right angle thereof at the center point M.

In the circular cross-section QS2, the first feed point A13 is arranged at an angle $\alpha 13$ of 202.5° or −157.5° relative to a horizontal axis of the circle or of the circular cross-section QS3.

The second feed point A23 is arranged at an angle $\alpha 23$ of 292.5° or −67.5° relative to a horizontal axis of the circle or of the circular cross-section QS3.

These angle values here are exemplarily indicated as specific values, but cab be varied in a range of x=±10°.

With this arrangement of the two feed points A13 and A23, as well as due the adjustable phase position of the two partial signals SS11 and SS21, the antenna arrangement ANT forms an elliptically polarized B1 magnetic field that can be adapted to the respective patients, or to the particular body region to be examined.

In the arrangement described herein, the two partial signals SS11 and SS21 exhibit a phase difference of 90°, produced by the device for signal splitting SPLIT 1.

Phase differences of ≧90°, typically in a range from 130° to 150°, are particularly advantageous to improve the homogeneity of the B1 magnetic field.

This additional phase difference, which therefore lies in the range from 40° to 60°, is set by the device EV3 for phase adjustment.

In contrast to this, phase differences of the two partial signals S11 and S21 (before feeding into the antenna arrangement ANT) in the range of ≦90° are advantageous for examinations of the head.

In this case, the device SPLIT1 for signal splitting as well as the device EV3 for phase adjustment are appropriately dimensioned in order to achieve the required phase difference by their interaction.

For example, a phase difference of 90° could be produced in another manner by the device SPLIT1 for signal splitting, if a negative phase difference is set via the device EV3 for phase adjustment. For example, this can occur using a delay element.

Figure 2:
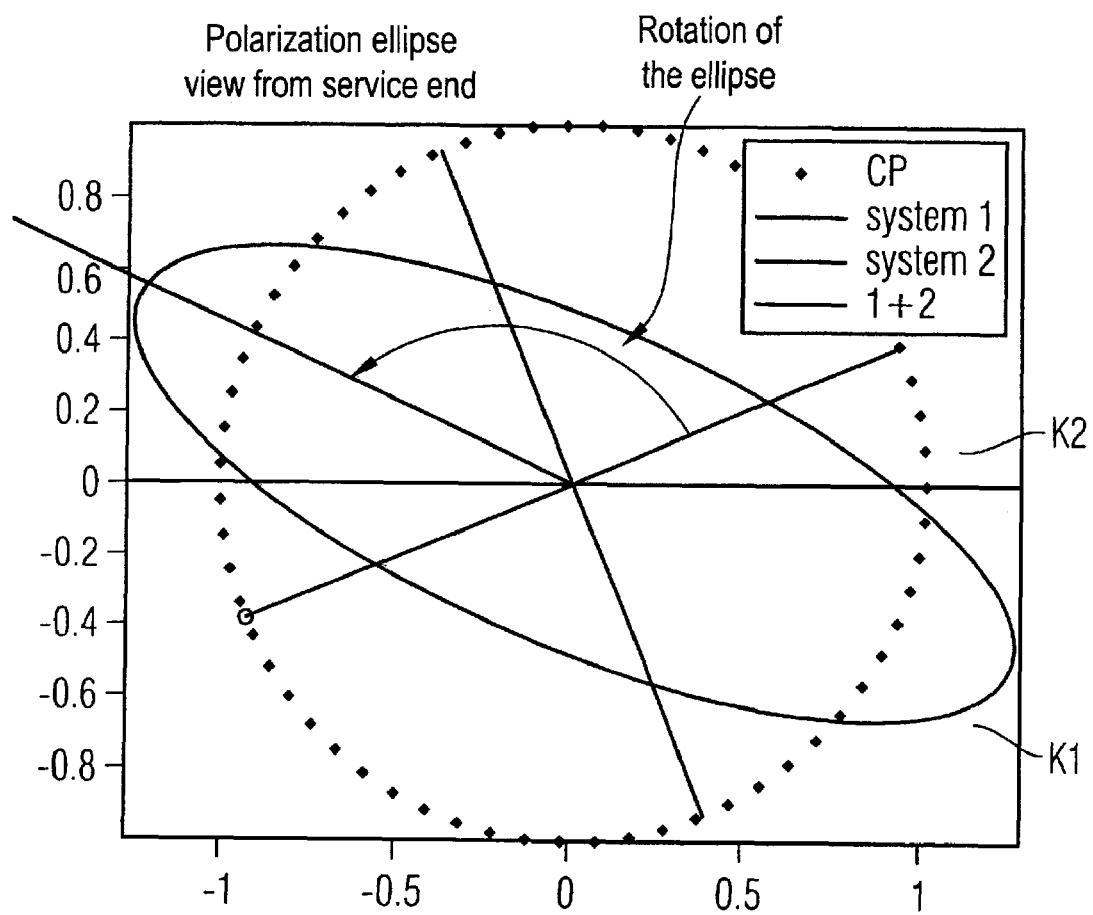
FIG. 2 is a representation of the elliptical polarization that can be generated via the arrangement according to the invention according to FIG. 1.
Figure 3:
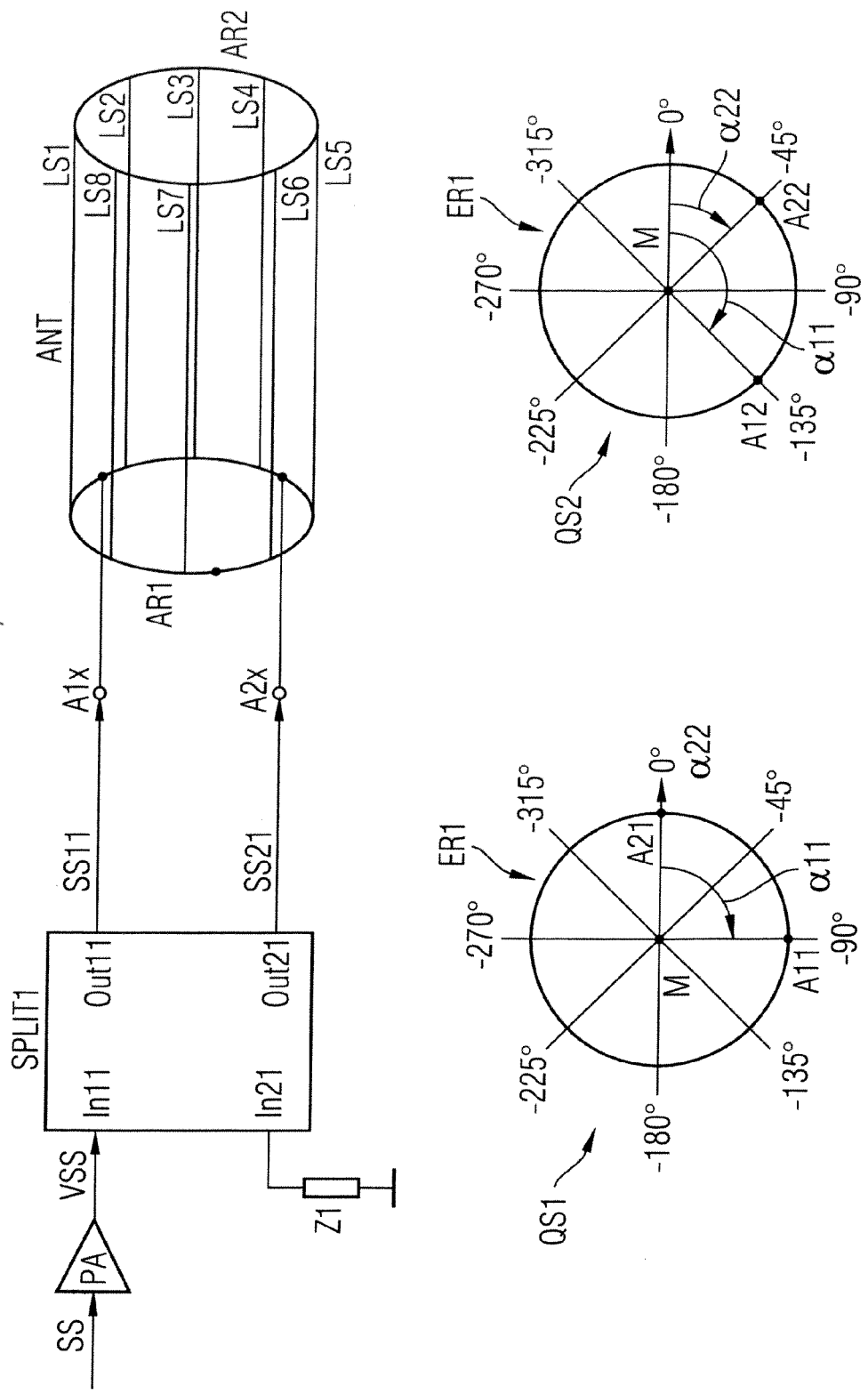
FIG. 3 shows the arrangement described in the specification preamble for feeding according to the prior art.
Figure 4:
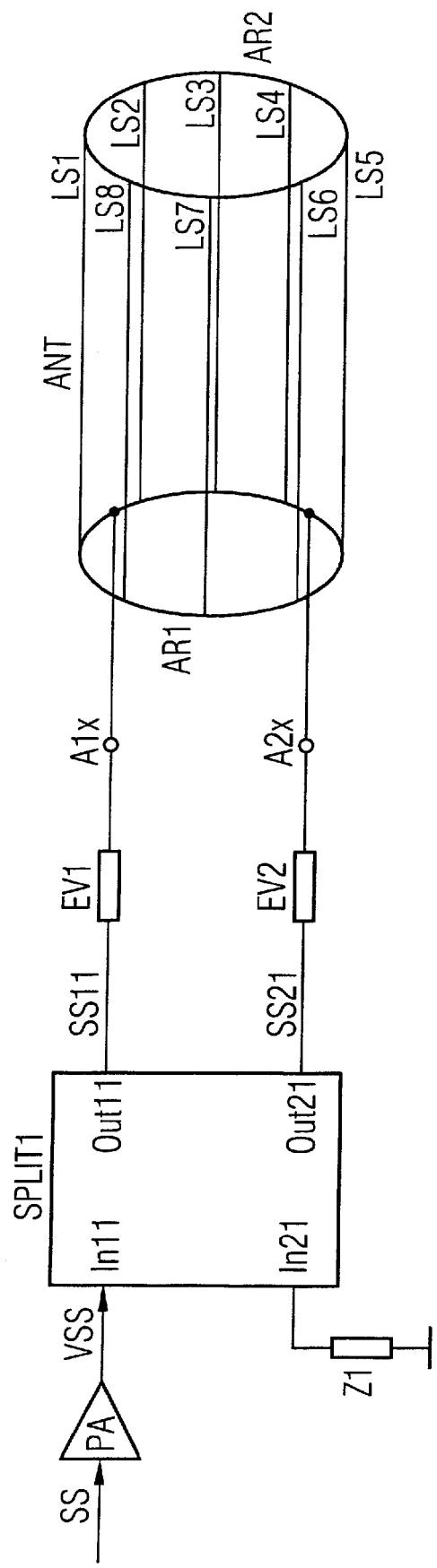
FIG. 4 shows the additional arrangement for feeding according to the prior art that is described above.

FIG. 2 shows a representation of an elliptical polarization of a B1 magnetic field that can be generated via the arrangement according to the invention according to FIG. 1.

The ellipse shape is set by the different phase ratio of the two partial signals that exhibit the same amplitudes and by the choice (selection) of the position of the two feed points.

A first elliptical polarization is shown by a first curve K1.

In order to produce this polarization, with regard to FIG. 1 the first partial signal SS11 is fed in with a phase or phase position of 0° at the first feed point A13. This first feed point A13 is at an angle of 202.5° or −157.5° relative to the horizontal axis of the circular cross-section QS3.

The second partial signal SS21 is correspondingly fed in with a phase or phase position of 143° at the second feed point A23. This second feed point A23 is at an angle of 272.5° or −67.5° relative to the horizontal axis of the circular cross-section QS3.

FIG. 2 shows, for comparison, a second curve K2 that corresponds to a circularly polarized magnetic field.

The presented polarization ellipse results along the antenna device ANT in the viewing direction.

In the embodiments presented herein, the two feed points A13 and A23 enclose an angle of 90° with the center point M.

A specifically more homogeneous B1 magnetic field distribution is achieved in examinations of patients with the aid of the arrangement according to the invention than with a conventional, circularly polarized arrangement.

It is thereby possible to distinctly reduce the hardware expenditure.

Different field ellipses can be achieved via variation of the phase offset of both partial signals or, respectively, via variation of the position of the two feed points of the antenna arrangement.

Although modifications and changes may be suggested by those skilled in the art, it is the intention of the inventors to embody within the patent warranted hereon all changes and modifications as reasonably and properly come within the scope of their contribution to the art.

We claim as our invention:

1. An apparatus configured to control an antenna arrangement in a magnetic resonance apparatus, said antenna arrangement having a cylindrical shape and having two feed points at which two partial signals are respectively fed to the antenna arrangement, said two feed points being located on a cross-section of the antenna arrangement having a center point, a first of the feed points forming a first angle with the center point relative to a horizontal axis of the cross-section and a second of the feed points forming a second angle, that is different from the first angle, with the center point of the horizontal axis, said apparatus comprising:

a signal splitting device having two outputs and an input, said signal splitting device receiving a radio-frequency magnetic resonance signal at said input and dividing said radio-frequency magnetic resonance signal received at said input into two partial signals of equal amplitude, said two partial signals being respectively emitted at said two outputs of said signal splitting device;

each of said two outputs of said signal splitting device being connected with precisely one of said two feed points of said antenna arrangement;

said first and second angles being selected in order to set an elliptical polarization of said antenna arrangement with a predetermined ellipse position in space;

a phase adjustment device connected between precisely one of said outputs of said signal splitting device and the feed point of the antenna arrangement connected thereto, said phase adjustment device setting a phase difference between said two partial signals that sets a predetermined semi-axis ratio for said elliptical polarization; and said first of said feed points being located at an angle of 202.5°+−10° relative to said horizontal axis, and said second of said feed points being located at an angle of 292.5°+−10° relative to said horizontal axis.

2. An apparatus as claimed in claim 1 wherein said first and second angles are set to produce said elliptical polarization in an examination region of the magnetic resonance apparatus.

3. An apparatus as claimed in claim 2 wherein said phase adjustment device sets said phase difference dependent on a patient, or a body region of a patient, in said examination region.

4. An apparatus as claimed in claim 1 wherein said antenna arrangement has a cylinder axis and a plurality of longitudinal rods parallel to said cylinder axis, and respective circular termination rings located at opposite ends of said longitudinal rods that electrically connect the respective opposite ends of said longitudinal rods, and wherein said first and second feed points are located on one of said termination rings.

5. An apparatus as claimed in claim 1 wherein said antenna arrangement has a cylinder axis and a plurality of longitudinal rods parallel to said cylinder axis, and respective circular termination rings located at opposite ends of said longitudinal rods that electrically connect the respective opposite ends of said longitudinal rods, and wherein said first and second feed points are located on respective longitudinal rods.

6. An apparatus as claimed in claim 1 wherein said signal splitting device emits said partial signals with a phase difference of 90° relative to each other.

7. An apparatus as claimed in claim 1 wherein said first of said feed points is located at an angle of 202.5° relative to said horizontal axis, and wherein said second of said feed points is located at an angle of 292.5° relative to said horizontal axis.

* * * * *